United States Patent
Sander et al.

(10) Patent No.: US 8,145,147 B2
(45) Date of Patent: Mar. 27, 2012

(54) POWER AMPLIFIER EDGE EVALUATION-ALTERNATIVE ENVELOPE MODULATOR

(75) Inventors: Wendell B. Sander, Los Gatos, CA (US); Earl W. McCune, Jr., Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 553 days.

(21) Appl. No.: 12/394,543

(22) Filed: Feb. 27, 2009

(65) Prior Publication Data
US 2009/0237157 A1   Sep. 24, 2009

Related U.S. Application Data

(60) Provisional application No. 61/068,506, filed on Mar. 5, 2008.

(51) Int. Cl.
*H04B 1/04* (2006.01)

(52) U.S. Cl. ............................ 455/108; 455/113

(58) Field of Classification Search .......... 455/108–111, 455/113
See application file for complete search history.

(56) References Cited

U.S. PATENT DOCUMENTS

| | | | | |
|---|---|---|---|---|
| 6,665,525 | B2 * | 12/2003 | Dent et al. ........................ | 455/108 |
| 7,251,462 | B2 * | 7/2007 | Matsuura et al. .............. | 455/108 |
| 7,408,413 | B2 * | 8/2008 | Ripley .......................... | 330/285 |
| 7,949,316 | B2 * | 5/2011 | Takinami et al. ........... | 455/127.1 |
| 8,000,659 | B2 * | 8/2011 | Nakamura et al. ............ | 455/110 |

* cited by examiner

*Primary Examiner* — An Luu

(57) ABSTRACT

A modulator includes a power driver, a power amplifier, and a heterojunction bipolar transistor (HBT) type device. The power driver is for receiving an amplitude modulation signal and for providing a control signal. The power amplifier is for receiving a phase modulation signal, a bias voltage, and the control signal. The power amplifier is for providing a radio frequency signal as an output based on the phase modulation signal, the bias voltage, and the control signal. The switching device is for coupling the power driver to the power amplifier such that the control signal is provided to the power amplifier in a timely manner.

20 Claims, 16 Drawing Sheets

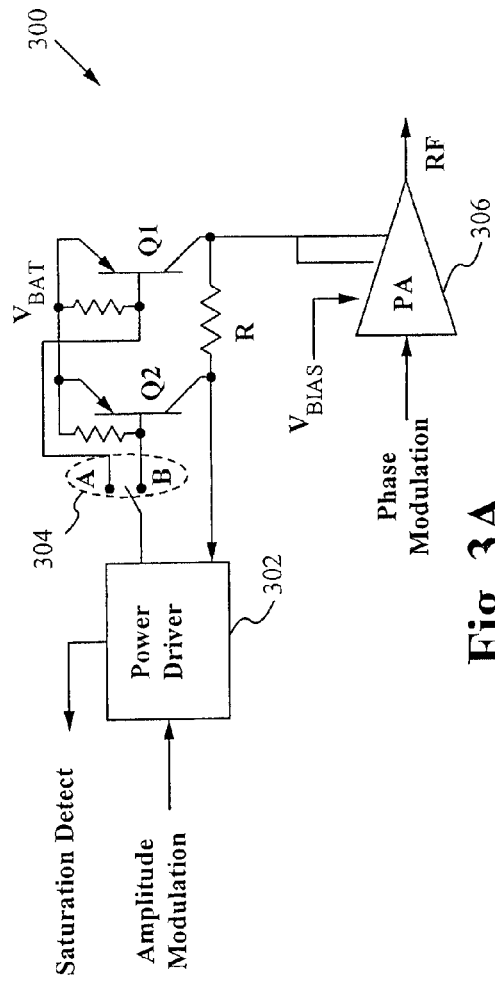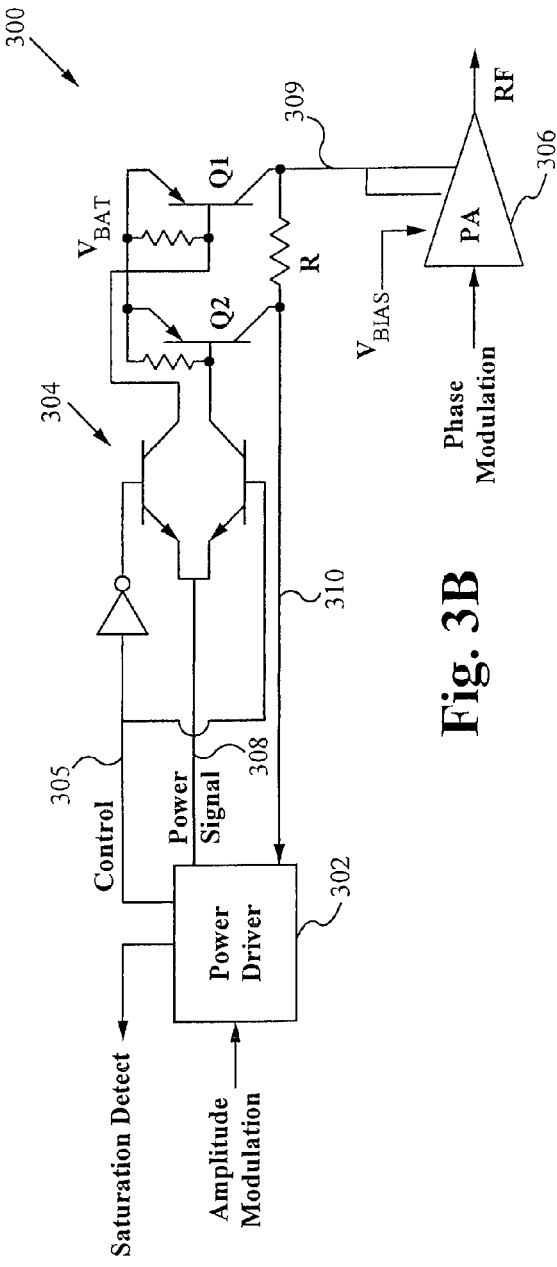
Fig. 3A
Fig. 3B

POWER AMPLIFIER EDGE EVALUATION-ALTERNATIVE ENVELOPE MODULATOR

Related Application(s):

This Patent Application claims priority under 35 U.S.C. §119(e) of the, co-owned U.S. Provisional Patent Application Ser. No. 61/068,506, filed Mar. 5, 2008, and entitled "POWER AMPLIFIER EDGE EVALUATION - ALTERNATIVE ENVELOPE MODULATOR " which is also hereby incorporated by reference in its entirety.

FIELD OF THE INVENTION

The present invention is related to the field of envelope modulation, and is more specifically directed to power amplifier Enhanced Data Rates for GSM Evaluation (EDGE) evaluation for alternative envelope modulation.

BACKGROUND

The heterojunction bipolar transistor (HBT) is an improvement of the bipolar junction transistor (BJT). HBT devices can handle signals of very high frequencies such as up to several hundred gigahertz, for example. Hence, HBT technology has certain advantages in modern fast circuits, such as radio frequency (RF) systems. HBTs made of Indium Phosphide and/or Indium Gallium Arsenide (GaAs) have advantages for use in optoelectronic integrated circuits. Among other HBT applications are mixed signal circuits such as analog-to-digital and digital-to-analog converters.

SUMMARY OF THE DISCLOSURE

A modulator comprises a power driver for receiving an amplitude modulation signal and generating a control signal and a power signal, a switching device coupled to the power driver to receive the control signal and the power signal and generate a switched power signal, and a power amplifier coupled to the switching device to receive the switched control signal, a phase modulation signal, and a bias voltage, and generate a radio frequency signal.

The switching device of a particular embodiment includes a heterojunction bipolar transistor (HBT) that is configured for high speed operation. Typically, the switching device has a channel resistance, a switch component, and an offset voltage. Preferably, the modulator has a supply voltage and a load resistance coupled to the switching device such that a current flows through the modulator. The current is involved in the generation of the radio frequency signal.

Preferably, the current is approximated by the quantity of the supply voltage less an offset voltage, divided by the sum of the load resistance and the channel resistance. For large amplitude input signals, the supply voltage is generally greater than the offset voltage. Further, some embodiments are designed such that the load resistance is greater than the channel resistance. In these embodiments, the current is approximated by the supply voltage divided by the load resistance. For small amplitude input signals, some embodiments include a modulating resistance coupled in series with the load resistance such that the current is approximated by the supply voltage divided by the sum of the load resistance and the modulating resistance.

Preferably, the radio frequency signal is based on the phase modulation signal, the bias voltage, and the control signal. For instance, in particular embodiments, the bias voltage is used to modify the modulation signal in response to the control signal. Typically, a feedback signal is provided to the power driver, and preferably also the power driver provides a saturation detection signal.

Some embodiments further include a first transistor and a second transistor. The first transistor is configured for operation when an input signal comprises a large amplitude signal. The second transistor is configured for operation when the input signal comprises a small amplitude signal. The switching device is preferably configured to provide the control signal to the power amplifier in a timely manner.

A method of modulation receives an amplitude modulation signal, and provides a control signal and a switched power signal based on the amplitude modulation signal. The method receives a phase modulation signal and a bias voltage, and generates a radio frequency signal based on at least one of the phase modulation signal, the bias voltage, the switched power signal, and the control signal. Generating the radio frequency signal includes switching by using a high frequency device such as a heterojunction bipolar transistor (HBT), for example. Typically, the phase modulation signal is modified by using the bias voltage. Some embodiments select a supply voltage and a load resistance, and apply the supply voltage across the load resistance, such that a current is generated through the load resistance. Preferably, the selected supply voltage is greater than an offset voltage of the high frequency device, and the selected load resistance is greater than a channel resistance of the high frequency device, such that the current is approximated by the supply voltage divided by the load resistance.

Some embodiments select a modulating resistance and include the modulating resistance, such that the current is approximated by the supply voltage divided by the sum of the load resistance and the modulating resistance. Preferably, the generation of the radio frequency signal is controlled by using the control signal via the high frequency device.

BRIEF DESCRIPTION OF THE DRAWINGS

The novel features of the invention are set forth in the appended claims. However, for purpose of explanation, several embodiments of the invention are set forth in the following figures.

FIG. 3A illustrates a modulation circuit according to some embodiments of the invention.

FIG. 3B illustrates the modulation circuit according to some embodiments of the invention having an HBT switch.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

In some embodiments of the invention, a modulator employs advanced switching techniques such as by using an HBT device. Preferably, some of these embodiments overcome the issues presented by the properties of HBT devices in conjunction with the issues of modulation. In some embodiments, the HBT device is configured for high speed operation, such as at speeds greater than 2 gigahertz.

Figure 1:
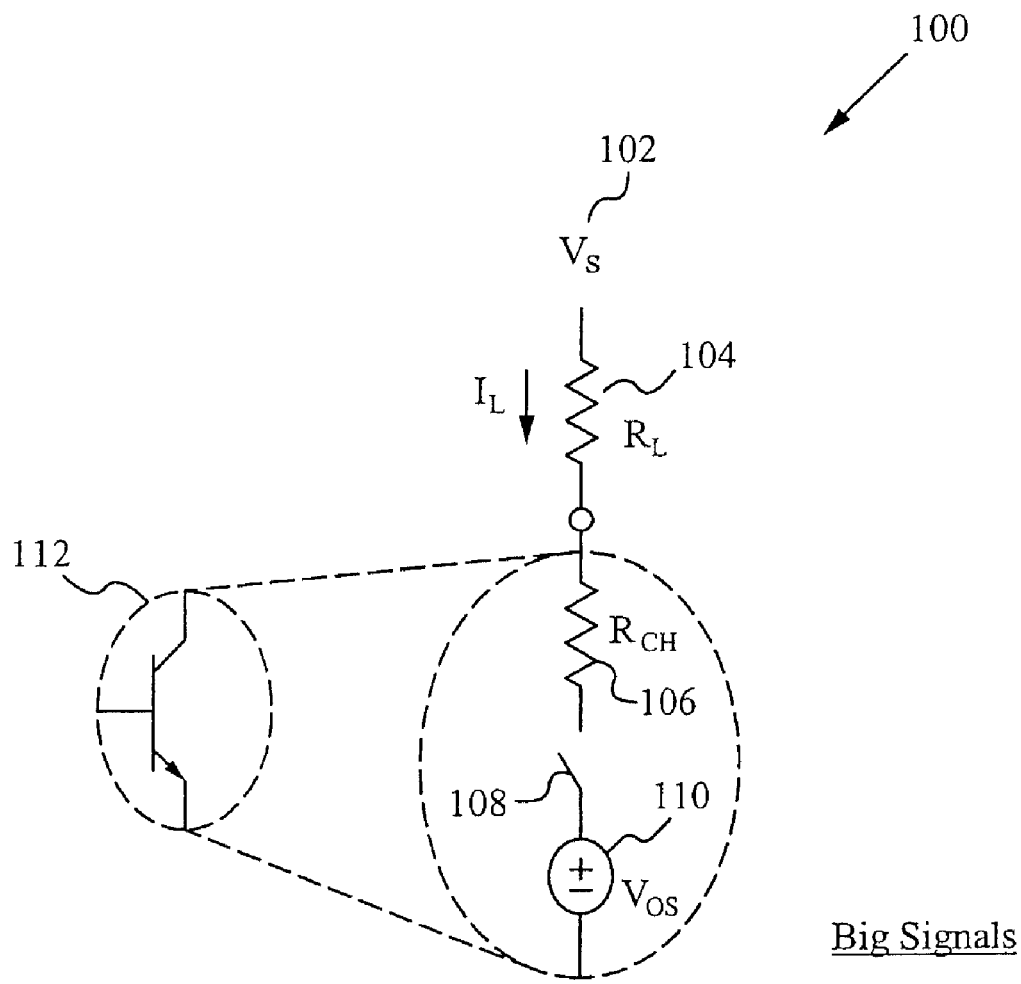
FIG. 1 illustrates an HBT serving as a switch for large amplitude signals.

For instance, FIG. 1 illustrates an HBT serving as a switch for large amplitude signals. In particular, FIG. 1 illustrates a circuit 100 that includes a supply voltage ($V_S$) 102, a load resistance ($R_L$) 104, a channel resistance ($R_{CH}$) 106, a switching element 108, and an offset voltage ($V_{OS}$) 110. Preferably, the switching element 108 is configured for switching of large amplitude signals, and for connectivity at several channels of the switching element 108. The offset voltage $V_{OS}$ 110 is typically not fixed, but is a function of the other components of the system. The channel resistance $R_{CH}$ 106, the switching element 108, and the offset voltage $V_{OS}$ 110, are preferably implemented by using an HBT type device, such as the transistor 112 of FIG. 1.

Accordingly, when power is supplied to the circuit 100 and the switching element 108 is closed, a load current $I_L$ flows from the supply voltage $V_S$ 102, through the load resistance $R_L$ 104, and also through the channel resistance $R_{CH}$ 106, through the closed switching element 108, and the offset voltage $V_{OS}$ 110. The load current $I_L$ is preferably used in the generation of an output signal.

General Equation and Large Amplitude Signals

Using a Gallium Arsenide (GaAs) HBT type device with a collector emitter saturation voltage ($V_{CESAT}$) of approximately 90 mV, the large amplitude signal range is above 270 mV. In the circuit 100 of FIG. 1, for the load represented by the load resistance $R_L$ 104, the load current $I_L$ is described by the following general equation:

$$I_L = (V_S - V_{OS})/(R_L + R_{CH}) \quad (1)$$

For large amplitude signals, the supply voltage is much greater than the offset voltage:

$$V_S \gg V_{OS} \quad (2)$$

Moreover, the load resistance $R_L$ 104 is preferably larger than the channel resistance $R_H$ 106 by design. Hence, for large signals, the two terms $V_{OS}$ and $R_{CH}$, in the general equation (1), that relate to the HBT type device, have lesser effect and the load current $I_L$ is approximated by:

$$I_L \approx V_S / R_L \quad (3)$$

In these embodiments, the electrical current(s) flowing through the system are controlled by components that are external to the transistor 112, and different types of transistors, including high frequency and/or high efficiency HBT's, are advantageously used without undesirable effects.

Small Amplitude Signals

Figure 2:
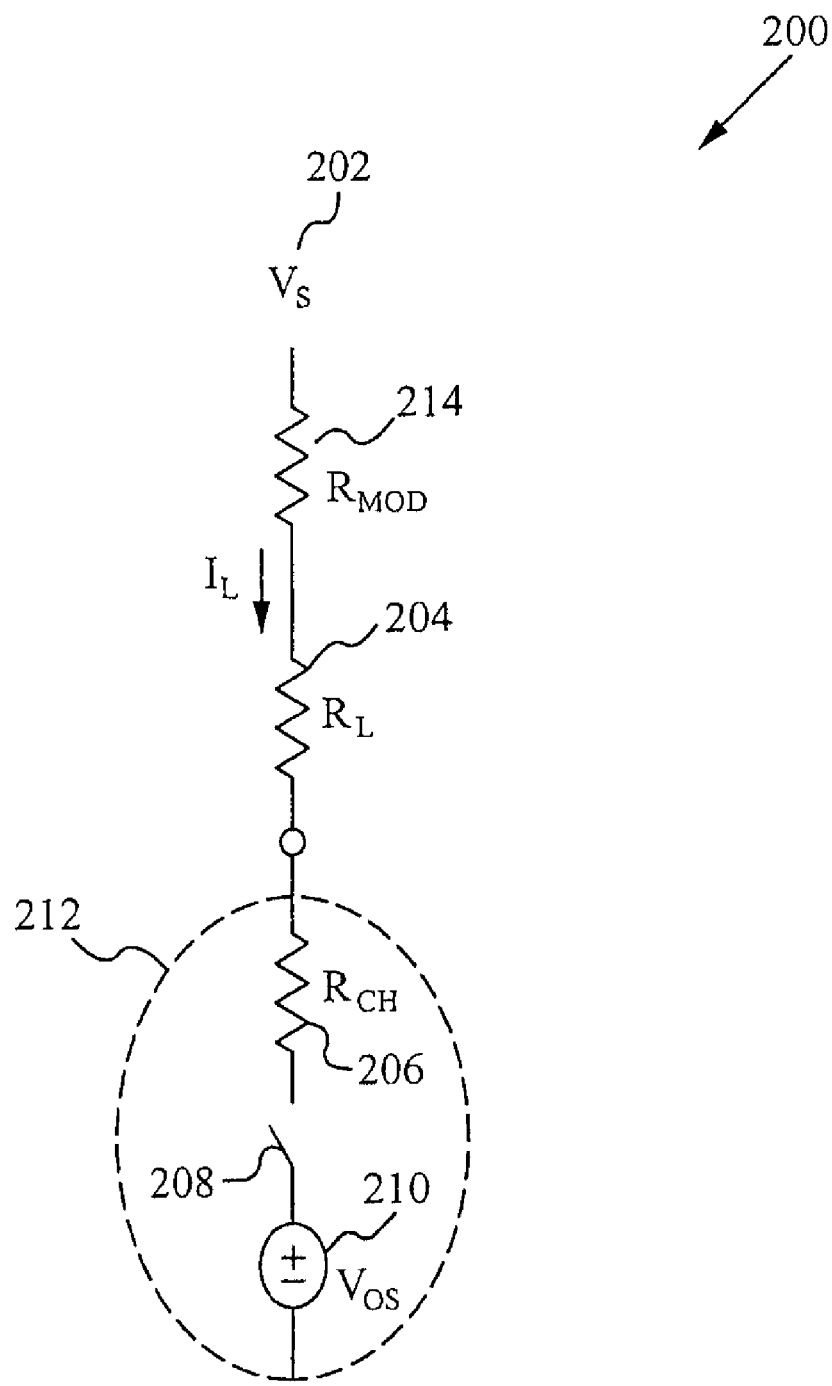
FIG. 2 illustrates an HBT serving as a switch for small amplitude signals in accordance with some embodiments of the invention.

Using a Gallium Arsenide (GaAs) HBT type device with a collector emitter saturation voltage ($V_{CESAT}$) of approximately 90 mV, the small amplitude signal range is between 0 and 270 mV. When the amplitude of the signal is not large, the approximations are not typically the same as for the case of large signals described above in relation to equations (2) and (3), and the more general equation (1) applies. However, in the case of smaller signals, the electrical current also tends to be small. Hence, for smaller signals some embodiments additionally employ a modulating resistor ($R_{MOD}$). Such an embodiment is included in FIG. 2, which illustrates an HBT serving as a switch for smaller signals than the signals of FIG. 1. As shown in FIG. 2, the circuit 200 includes a supply voltage $V_S$ 202, a modulating resistor $R_{MOD}$ 214, a load resistance $R_L$ 204, and a device 212 that typically includes a channel resistance $R_{CH}$ 206, a switching element 208, and an offset voltage $V_{OS}$ 210.

Accordingly, the load current $I_L$ and the load resistance $R_L$ 204 are still the major components of this implementation of the general equation (1). More specifically, there is an additional current drop from the load current $I_L$ passing through the modulating resistor $R_{MOD}$ 214. This pushes the supply voltage $V_S$ 202 higher, and the system returns to a state similar to that described above where the load current is approximated by the equation (3): $I_L = V_S / R_L$.

Here, without the incorporation of the modulating resistor $R_{MOD}$ 214, the supply voltage $V_S$ 202 is lowered by the small signal input, and the offset voltage $V_{OS}$ 210 becomes significant in the equation (1). As the value of the offset voltage varies, it has a noticeable impact on the load current and the output of the system can undesirably drift. Hence, some embodiments employ the additional resistance of the modulating resistor $R_{MOD}$ 214 to bring the supply voltage up to a desirable level, such that the supply voltage $V_S$ 202 is higher than the offset voltage $V_{OS}$ 210. Preferably, the additional resistance of the modulating resister $R_{MOD}$ 214 has a small value. For instance, when the load resistance $R_L$ 204 has a value of about three ohms, the modulating resistance $R_{MOD}$ 214 preferably has a value of about seven ohms.

Generally, within the system 200 described above, the current flow is regulated and preferably behaves according to a modified version of the general and large signal equations, that is:

$$I_L \approx V_S/(R_L+R_{MOD}) \quad (4)$$

Since, according to this equation (4), the load current for the small signal cases employing a modulating resistor $R_{MOD}$ 214 is lower than the cases above for large signals, there is some efficiency loss. However, these embodiments advantageously achieve a desired goal of manufacturing stability. Stated differently, the transistor specific parameter is controlled in the embodiments described above, regardless of the type of device 212 used. Where, as described above, the device 212 comprises an HBT, the mathematical terms characteristic of HBT devices advantageously do not appear in the first order equations that govern the load current. As mentioned, the load current is typically involved in generating the output signal. Hence, the output is preferably independent of the particular device 212 employed in the system, and retains the benefits of the particular device, such as an HBT, without the negative side effects.

Implementation within Power Amplifier

Accordingly, some embodiments further optimize the operation of a polar modulator with RF power stages built by using devices such as heterojunction bipolar transistors (HBT), for example.

HBT devices exhibit a nonlinear phenomenon known as collector-emitter saturation voltage ($V_{CESAT}$) near the origin of the device characteristic curves. This nonlinearity is most pronounced at low output power levels for this switched operation, such as in a polar transmitter. A previous approach, that met the EDGE specifications, was to use unusually high drive into the final stage. However, this approach forces switched operation. An alternative approach to address the nonlinearity is to operate the envelope modulator with higher output impedance for low output powers, along with connecting the power amplifier (PA) final and driver power supply nodes together. These implementations approximate a current source for the modulator, rather than the voltage source. However, theses cases performed the worst in the tests described below.

Instead, FIGS. 3A and 3B illustrate a modulation circuit used in accordance with particular embodiments of the invention. More specifically, FIG. 3A illustrates a dual-mode envelope modulator 300 for switched polar modulation. As shown in this figure, the modulator 300 includes a power driver 302 that receives an amplitude modulation signal and outputs a saturation detect signal (SAT). In some embodiments, the SAT is able to be used to detect whether the power driver 302 or the power amplifier 306, or both, have gone into saturation or clipping. When such a condition occurs, the SAT is able to be used to signal an attenuator (not shown) to attenuate the amplitude modulation signal to bring any block in saturation out of saturation. The power driver 302 is coupled via an "A/B" switch 304 to a pair of transistors Q1 and Q2. The switch 304 is shown in an exemplary implementation as a pair of HBT transistors in FIG. 3B. It will be apparent to those of ordinary skill in the field of integrated circuit design that an A/B transistor switch can be implemented in any number of configurations which need not be described in detail. Furthermore, any convenient algorithm or method for selecting A or B, and by extension the transistor Q1 or the transistor Q2, is able to be employed. By way of example, a predetermined threshold is able to be one input to a comparator (not shown), where the other input is the power signal 308. Based on the comparison, the comparator will toggle the control signal 305 to a logic high value or a logic low value to effectuate switching between the transistor Q1 and the transistor Q2 as shown in FIG. 3B. Many other implementations will readily present themselves to integrated circuit designers of ordinary skill, including but not limited to hard wired logic, state machines, or the like. The emitter leads of the transistors Q1 and Q2 are further coupled to their respective base leads, each by a resistive element.

As mentioned above, the collector leads of the transistors Q1 and Q2 are coupled together via an optional resistor R, and provide a feedback signal to the power driver 302. Generally, feedback is used as a means of error correction. By way of example, the power driver 302 is able to detect through the feedback whether the transistor Q1 or the transistor Q2 is being used to drive the power amplifier 306, and make any appropriate corrections. The collector leads of the transistors Q1 and Q2 are further coupled to an input of a power amplifier 306, since either of the transistors Q1 or Q2 is able to drive the power amplifier 306. The power amplifier 306 receives as input a phase modulation signal and a voltage bias signal ($V_{BIAS}$), and outputs a radio frequency signal based on the switched power signal 309 from the transistors Q1 or Q2.

In operation of the circuit 300, the transistor Q1 is preferably active for high power levels and the transistor Q2 is active for low power levels. The Control Signal 305 is set to high or low depending on an internal threshold in the power driver 302 or other circuitry, thereby effectuating transfer of the power signal 308 through the switch 304. The power amplifier 306 receives a switched power signal 309. In some embodiments, the power amplifier 306 modulates the switched power signal 309 according to the phase modulation signal to generate a radio frequency output signal. For the illustrated test setup, the effect of the circuit of FIGS. 3A and 3B is simulated by adding the resistor R for low power levels, and bypassing the resistor R for high power levels. In the embodiments described herein, the exemplary value used for the resistor R is about five ohms. However, one of ordinary skill recognizes additional values for the resistor R, in different implementations.

Operation

A transmitter that advantageously employs an HBT power stage, such as described above, functions across a variety of conditions, including across a variety of temperature and frequency conditions. In the following examples, EDGE 8 phase shift keying (PSK) test signals are used for testing across the variety of conditions and for several implementations. However, one of ordinary skill recognizes that these test signals, conditions, and implementations are exemplary, and further recognizes operation by using additional signal types.

As mentioned above, some embodiments optionally implement the resistor R at low ratings of about three to five ohms, for example. Some of these embodiments advantageously calibrate the power amplifier by starting with a voltage bias signal $V_{BIAS}$ at about 2.2 volts. It will be apparent to those of ordinary skill in the art of integrated circuit design that a bias voltage can be generated in a wide variety of ways, including but not limited to a bandgap reference, an external battery, or a voltage regulator.

Figure 4:
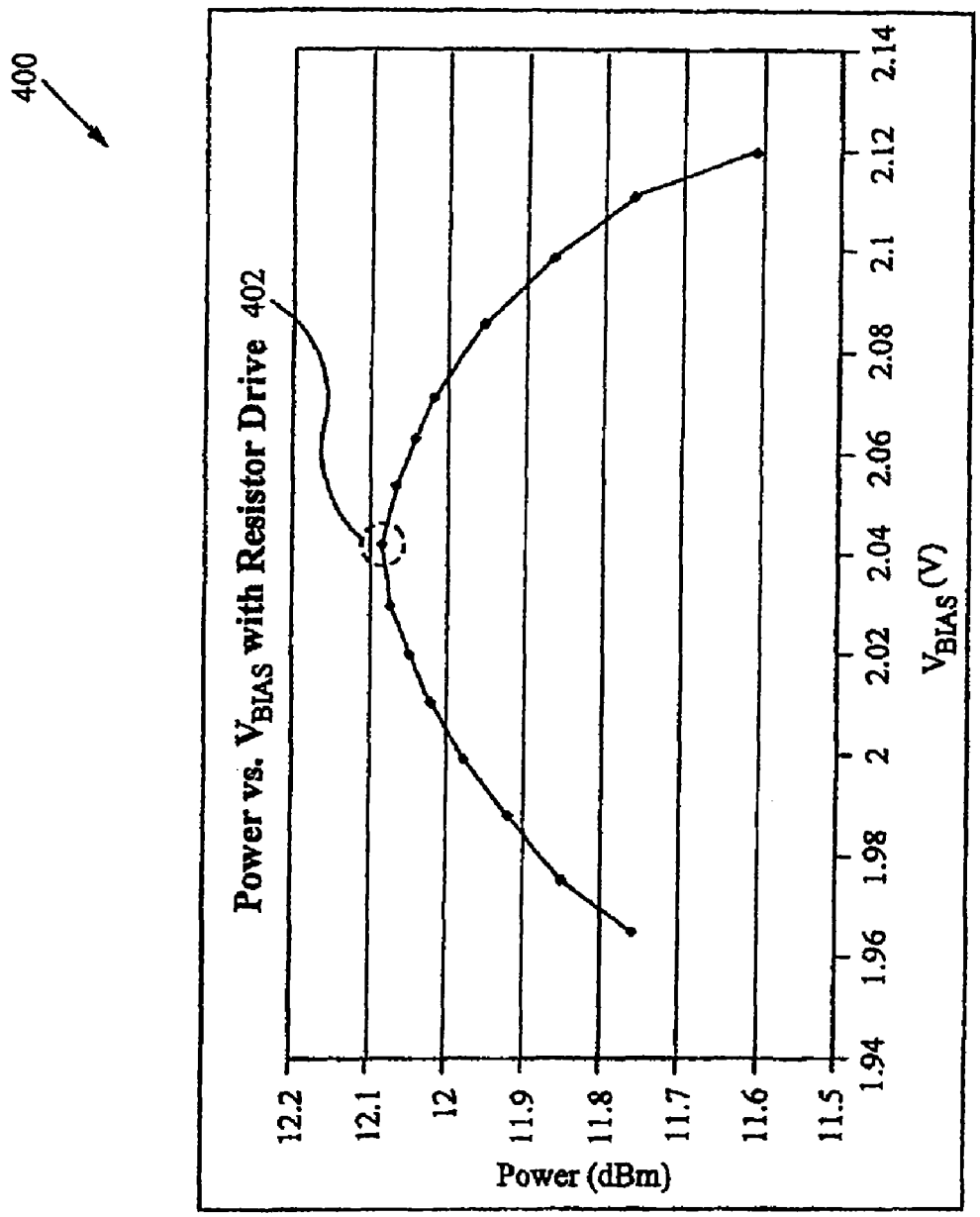
FIG. 4 is a chart illustrating power in relation to a voltage bias signal $V_{BIAS}$.

FIG. 4 is a chart illustrating power in decibel-milliwatts (dBm) in relation to a voltage bias signal $V_{BIAS}$. Hence, as shown in this figure, a particular operating point is located that typically maximizes power output. As also shown in FIG. 4, this preferred operating point represents a maximized efficiency point 402, for the operation of the circuit 300 of FIGS. 3A and 3B. As further illustrated in FIG. 4, one of ordinary skill readily identifies the point 402 and thereby, with the operating point 402, the power amplifier 306 of FIGS. 3A and 3B is advantageously calibrated for the appropriate voltage bias and output power level(s). The additional test examples discussed below further illustrate the stability of the maximized operating point 402.

Figure 5:
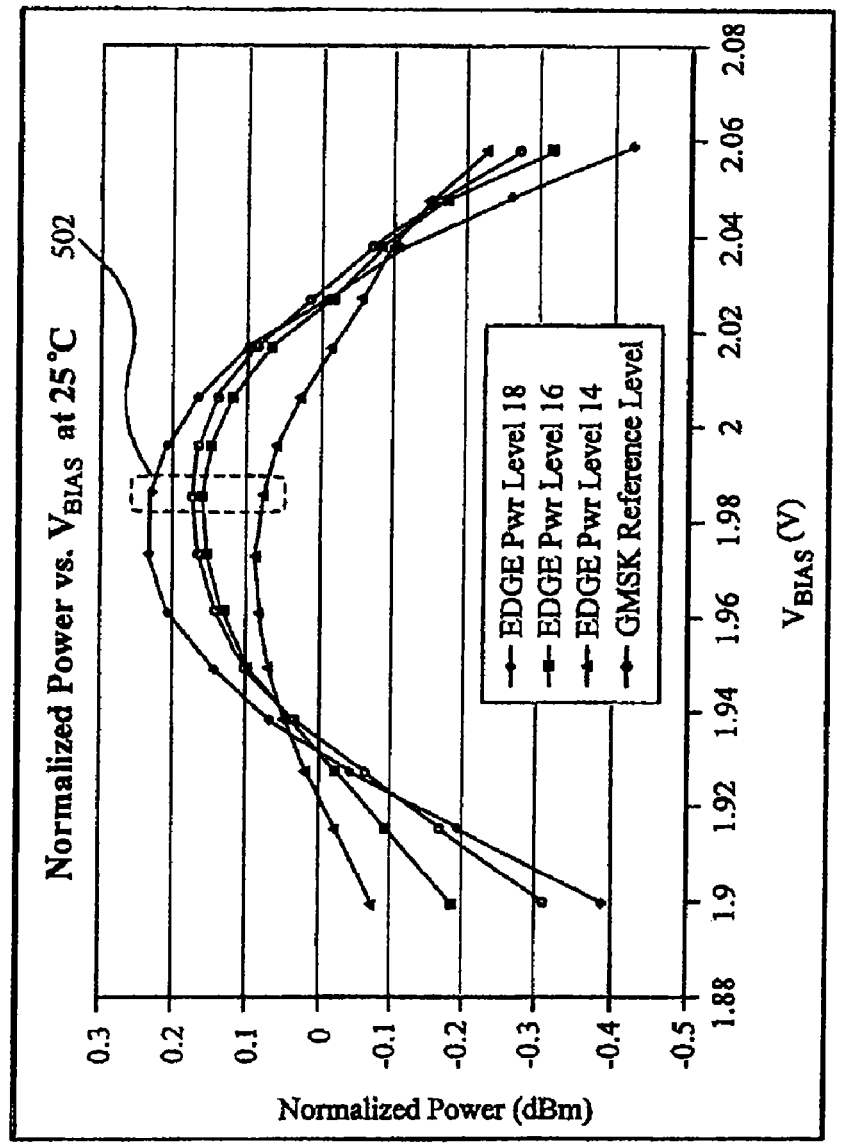
FIG. 5 illustrates power in relation to a voltage bias signal $V_{BIAS}$ normalized at 25 degrees Celsius for a variety of power levels.

For instance, FIG. 5 illustrates power in relation to a voltage bias signal $V_{BIAS}$ normalized at 25 degrees Celsius for a variety of power levels. As shown in this figure, the operating point 502 is advantageously independent of output power. Moreover, the Gaussian minimum shift keying (GMSK) curve shows that the operating point 502 is essentially independent of modulation. Thus, calibration of the operating point 502 is advantageously determined without any amplitude modulation.

Figure 6:
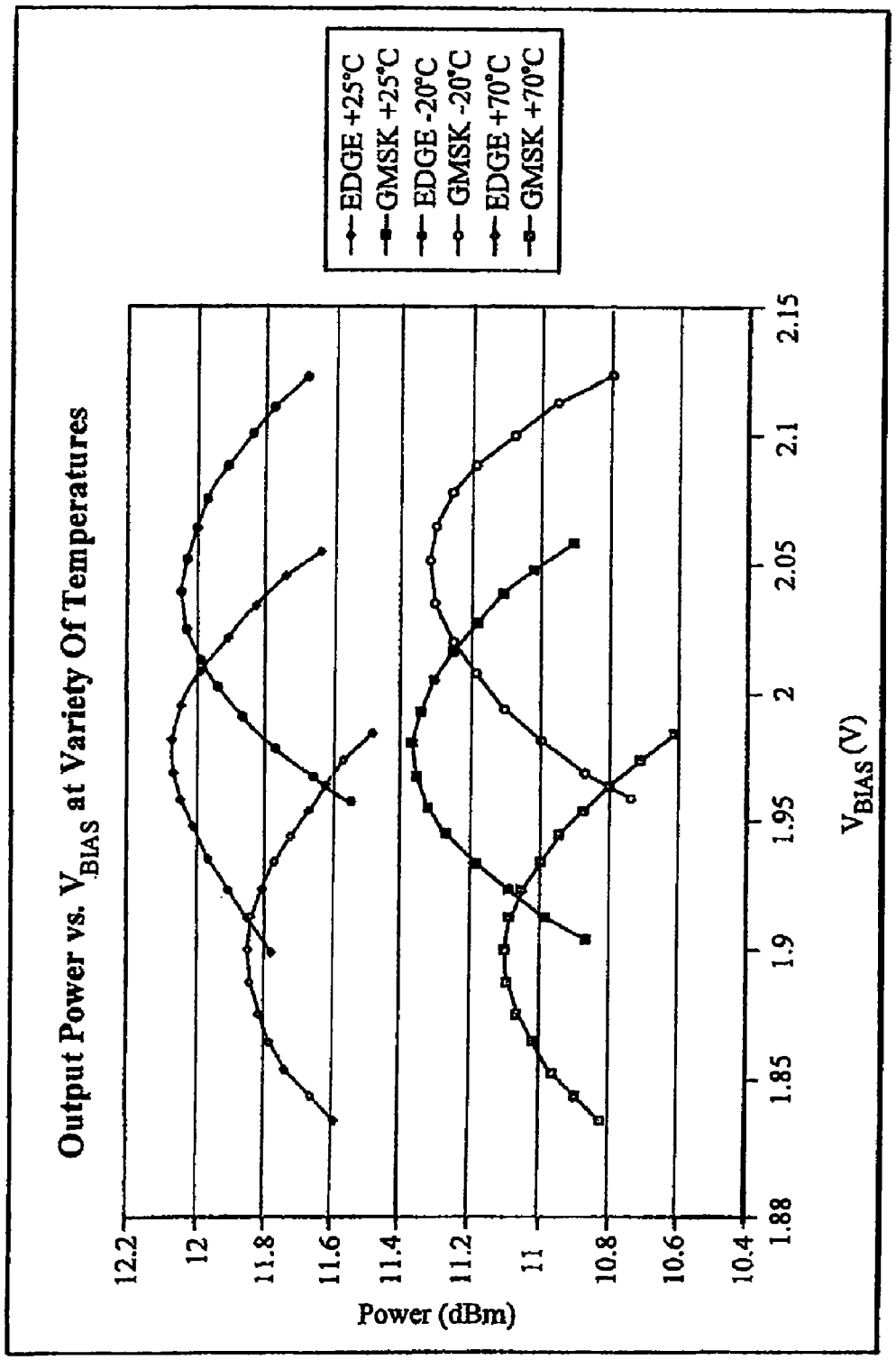
FIG. 6 illustrates power in relation to a voltage bias signal $V_{BIAS}$ at a variety of temperatures.

FIG. 6 illustrates output power in relation to a voltage bias signal $V_{BIAS}$ at a variety of temperatures. More specifically, FIG. 6 shows that the operating point moves about 1.6 mV per degree Celsius. This is approximately the temperature coefficient (TC) of a transistor. Some embodiments advantageously compensate for the temperature coefficient of the transistor, as needed. Some of these embodiments use the power amplifier to perform the compensation. However, in the descriptions and accompanying figures below, measurements were taken with and without compensation for drift of the maximized operation point, to determine whether compensation is useful. Operational drift is a factor that often requires compensation. Embodiments of the invention are adaptable to provide any needed compensation. However, as described below, compensation is advantageously not required by several embodiments of the invention.

Figure 7:
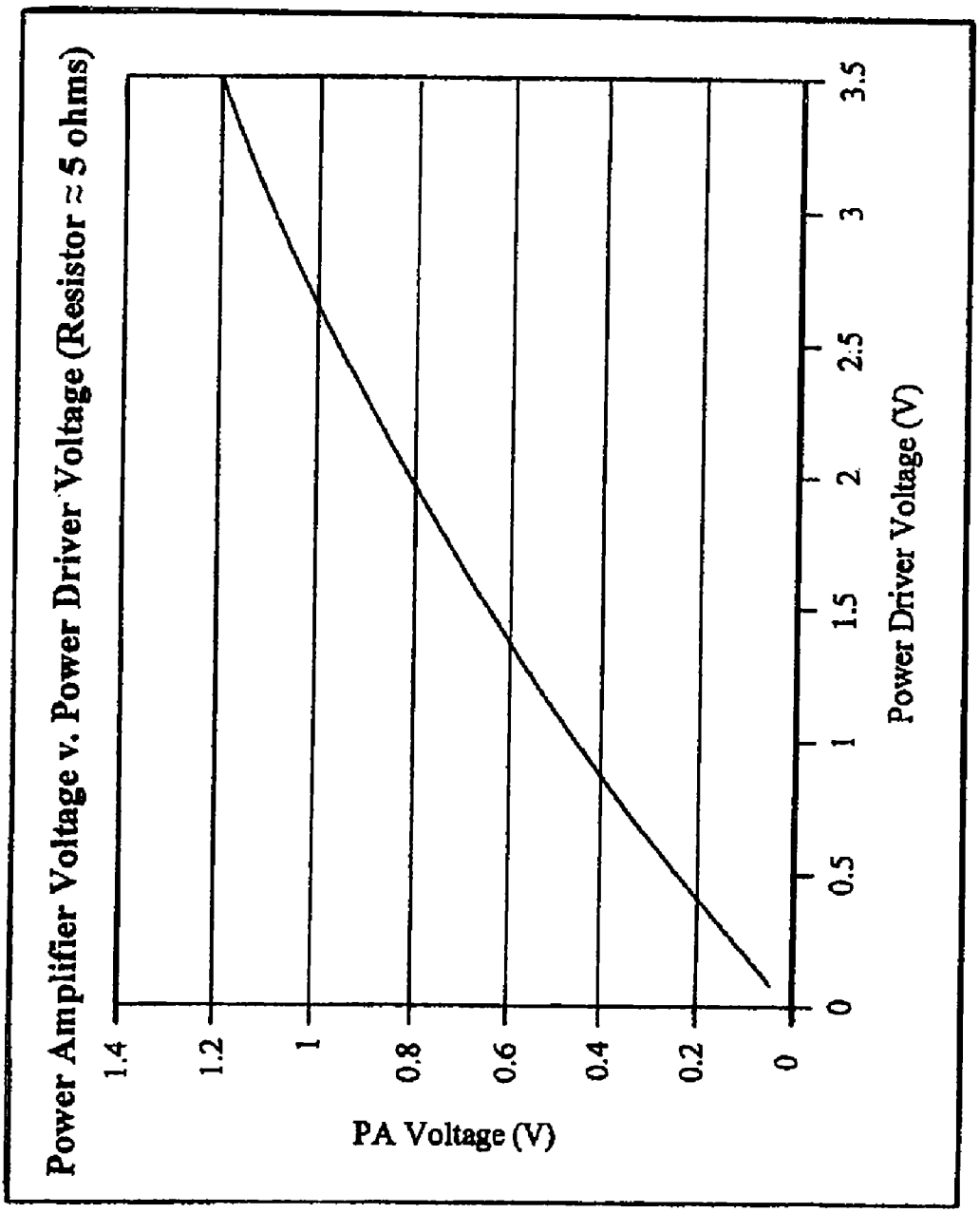
FIG. 7 illustrates power amplifier voltage as a function of power driver voltage with a five ohm resistor.

FIG. 7 illustrates power amplifier voltage as a function of power driver voltage with a resistor R of about five ohms. As shown in this figure, there is a relationship between the voltage on the final stage of the power amplifier 306 and the driver output voltage through the resistor R. For the illustrated implementation, the resistor R has a rating of about five ohms. In this implementation, the observed voltage across the power amplifier output stage is about one third the voltage on the driver output, at the feedback point.

Figure 8:
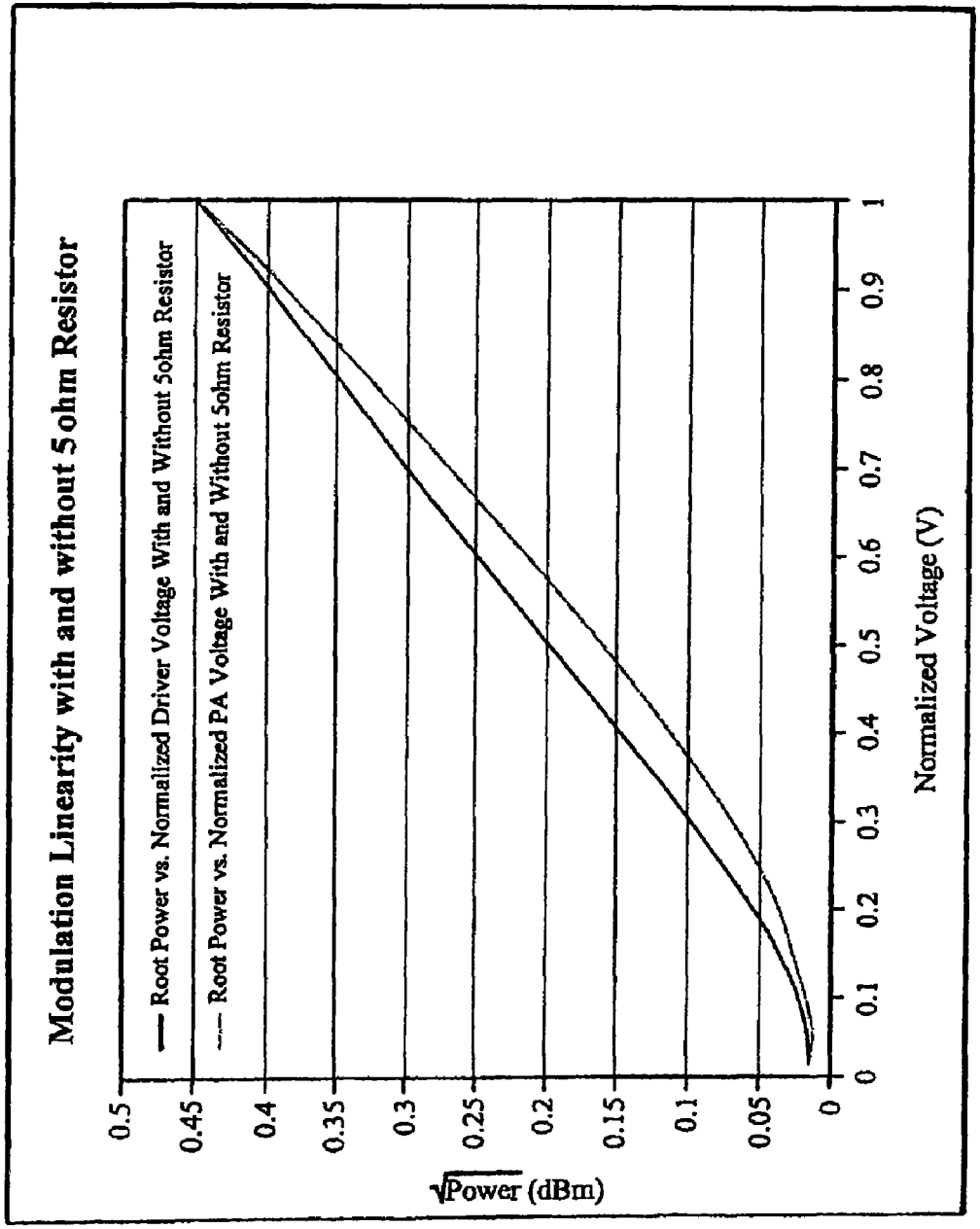
FIG. 8 illustrates modulation linearity with and without a five ohm resistor.
Figure 9B:
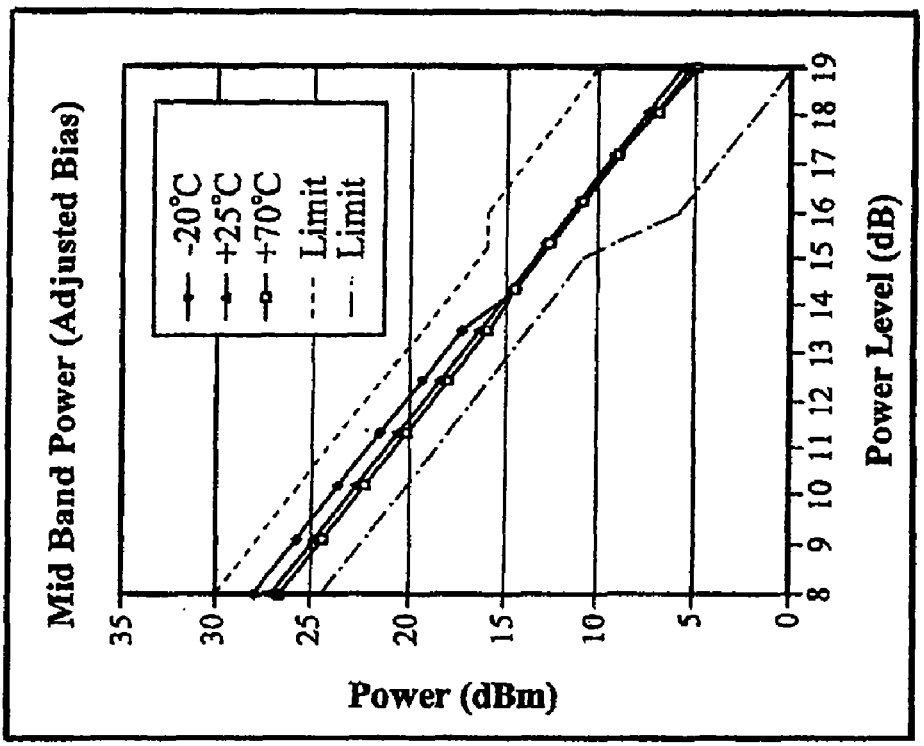
FIG. 9B illustrates mid band output power over power amplifier power level, with an adjusted bias.
Figure 9A:
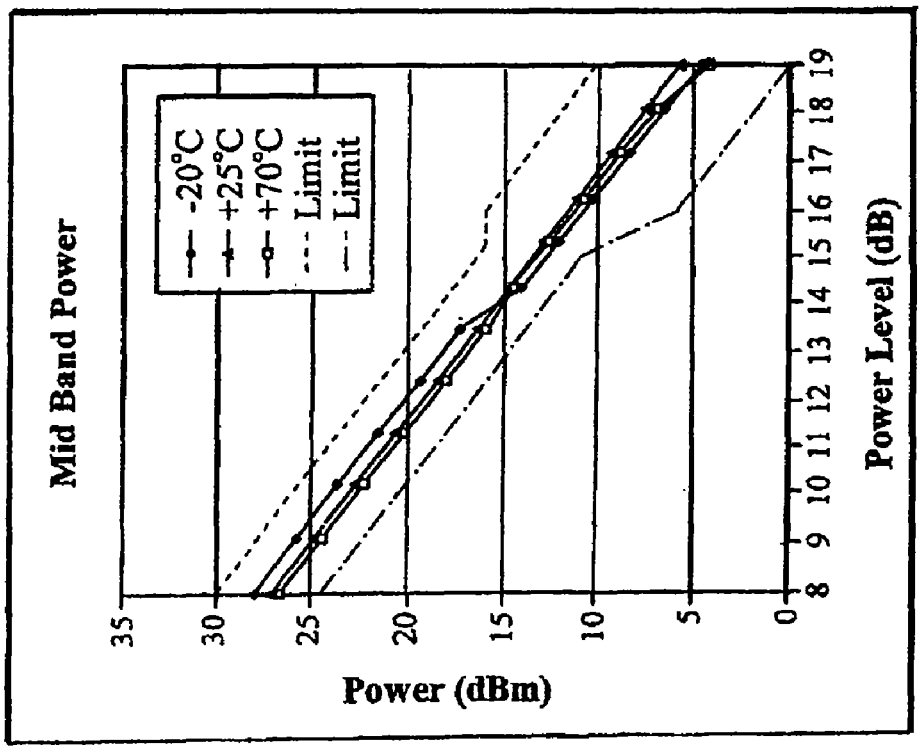
FIG. 9A illustrates mid band output power over power amplifier power level.

FIG. 8 illustrates modulation linearity with and without a resistor of about five ohms. FIG. 8 compares the normalized modulation linearity of signal at the power amplifier 306 and at the output of the power driver 302. Accordingly, FIG. 8 indicates that the modulation linearity is significantly improved with the resistor R. Moreover, FIG. 7 indicates that, with the resistor R, the input offset sensitivity of the output of the power driver 302 is reduced and the sensitivity to the HBT's $V_{CESAT}$ voltage is also reduced.

Advantages

Table 1 provides a summary of the operation of the power amplifier modulation systems and methods described above. For power levels 8 through 13 of Table 1, the final two stages of the power amplifier are driven together, with no resistor for high output power levels. For power levels 14 through 19, the resistor R is preferably inserted. Accordingly, Table 1 shows the maximum and minimum voltage provided from the power amplifier and to the power amplifier, when corrections were applied to give the performances described in further detail below. In the table, the combination of the reduced voltage bias signal $V_{BIAS}$ and the resistor R indicates that the power amplifier minimum voltage is about 240 mV, and hence, an output referred power amplifier offset of about 15 mV does not present a problem. In view of the foregoing, extreme offset reduction methods such as chopper stabilization are not needed using particular embodiments of the invention.

Another advantage of the foregoing systems and/or methods is that the power amplifier is operated in only two modes: (a) a voltage bias of 2.2 volts and no resistor, and (b) a voltage bias determined, such as in the manner described above, of about 1.98 volts and a five ohm resistor. Typically, the calibration equipment digitizes the demodulated power amplifier I and Q outputs when a ramp is presented as the envelope modulator input. Then, the required corrections are computed from this data. Preferably, this measurement requires only a fraction of a second to be performed. Since there are only two operating points to be measured per band, then only two such sweep measurements need to be performed in each frequency band. Hence, some embodiments advantageously perform complete power amplifier characterization within a few seconds, such as on a manufacturing line, if necessary, and yet the performance results still advantageously comport to the measurements described further below.

Performance Measurements

The following data shows the performance of some embodiments employing a modulator in conjunction with a sample power amplifier available from Panasonic™. The correction table calibration is performed at room temperature and center frequency. These calibration values are used across all of the temperatures and frequencies discussed herein. For the temperature test runs, data is recorded with and without bias voltage compensation for the operating point shift observed in FIG. 4.

In FIGS. 9 through 13, the "A" figure shows the performance with no adjustment and the "B" figure shows the effect of compensation, such as by adjusting the bias. FIG. 9A illustrates mid band output power in decibel-milliwatts over power amplifier power level. FIG. 9B illustrates mid band output power in decibel-milliwatts over power amplifier power level, with an adjusted bias. As shown in these FIGS. 9A-9B, the power is advantageously within the limits of the relevant specification, which in this case is the EDGE specification, regardless of temperature, and regardless of power level.

Figure 10B:
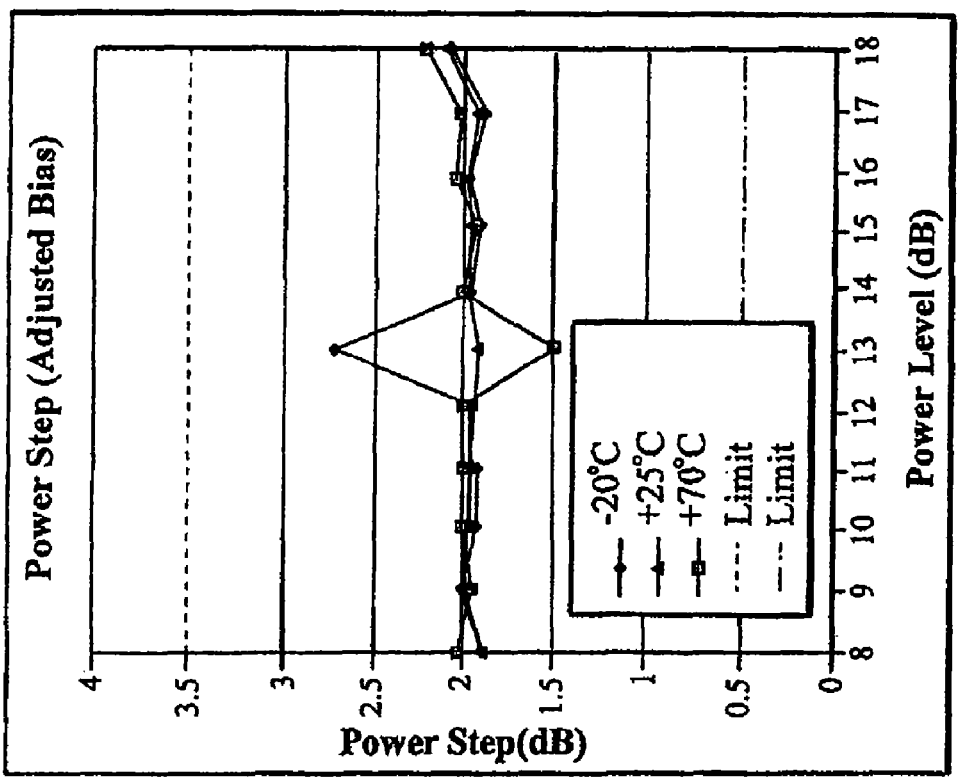
FIG. 10B illustrates power stepping for power amplifier power levels at various temperatures, with an adjusted bias.
Figure 10A:
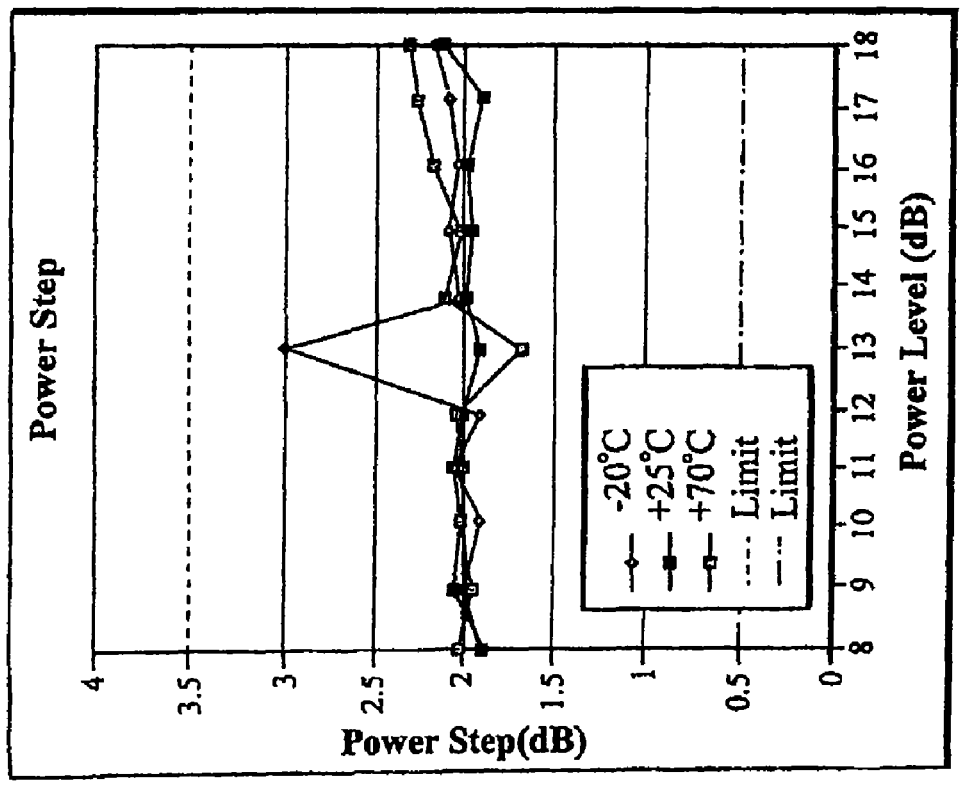
FIG. 10A illustrates power stepping for power amplifier power levels at various temperatures.

FIGS. 10A and 10B show the power step of some embodiments. FIG. 10A illustrates power stepping in decibels for the power amplifier power levels 8 through 18, at three temperatures (−20, +25, and +70 degrees Celsius). FIG. 10B illustrates power stepping in decibels for the power levels and temperatures of FIG. 10A, with an adjusted bias. As shown in these figures, there is a power step shift observed at temperature when the drive is changed to the resistor mode. However, as shown in these figures, the shift is still within the relevant specification limits.

Figure 11B:
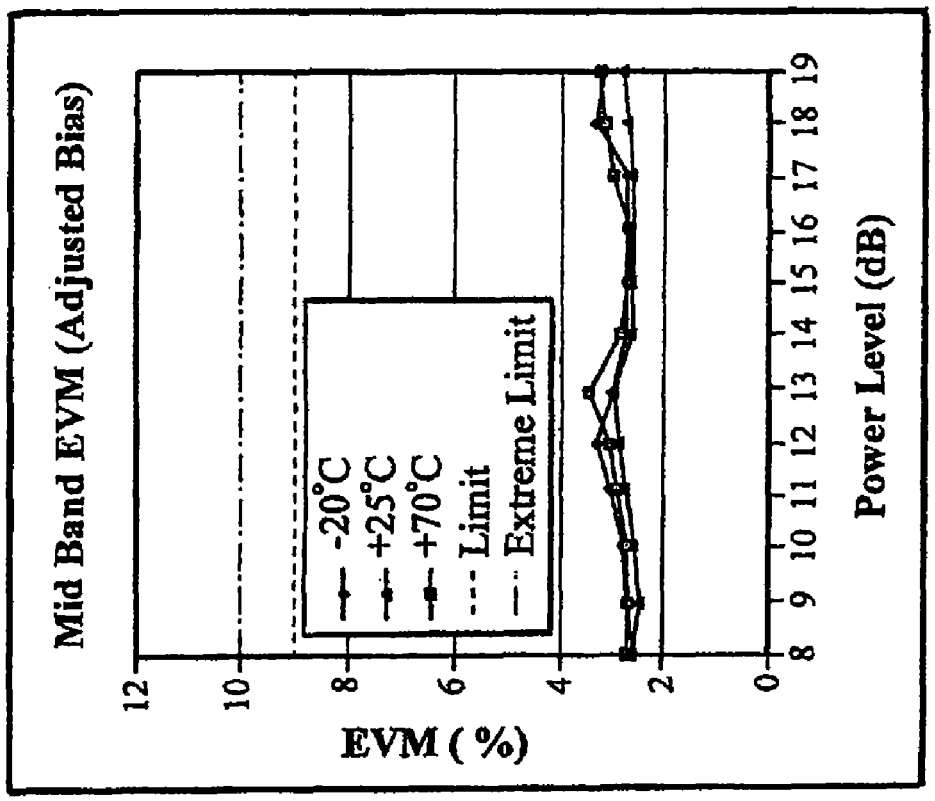
FIG. 11B illustrates the EVM over power amplifier power level at various temperatures, with an adjusted bias.
Figure 11A:
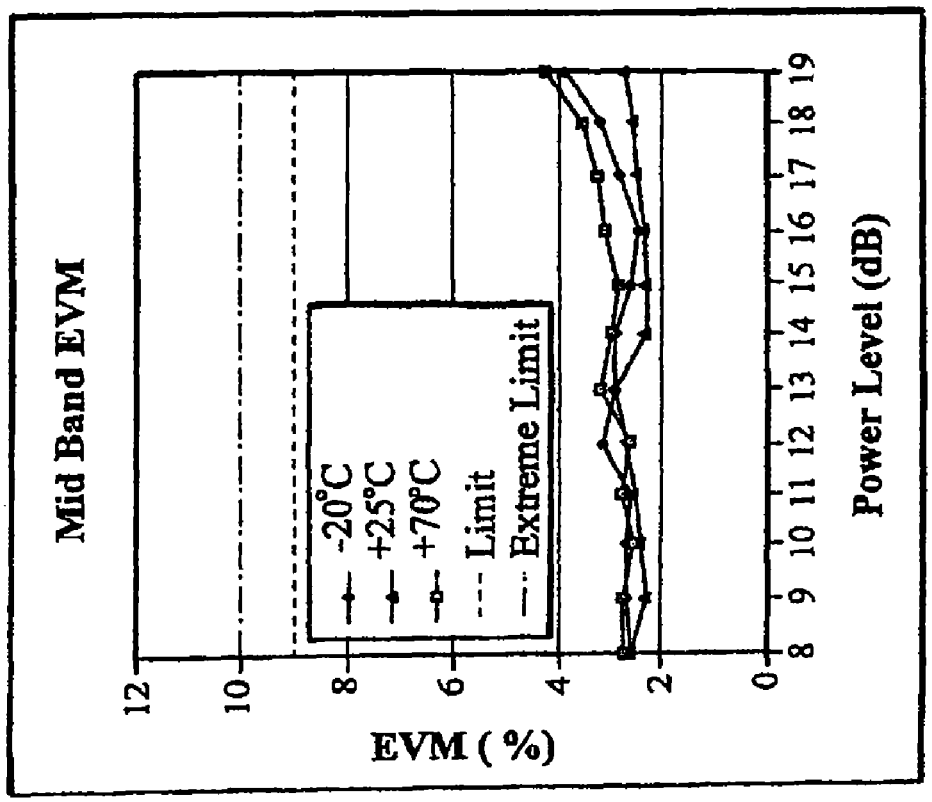
FIG. 11A illustrates the error vector magnitude (EVM) over power amplifier power level at various temperatures.

FIGS. 11A and 11B show the error vector magnitude (EVM) at different temperatures for a variety of power levels. FIG. 11A illustrates the EVM (in percent (%)) at temperatures of −20, +25, and +70 degrees Celsius, over power levels 8 through 19. FIG. 11B illustrates the EVM of FIG. 11A with an adjusted bias. As shown in these figures, the performance of the system is also within the specification. Moreover, the bias adjustment provides only a small improvement.

Figure 12B:
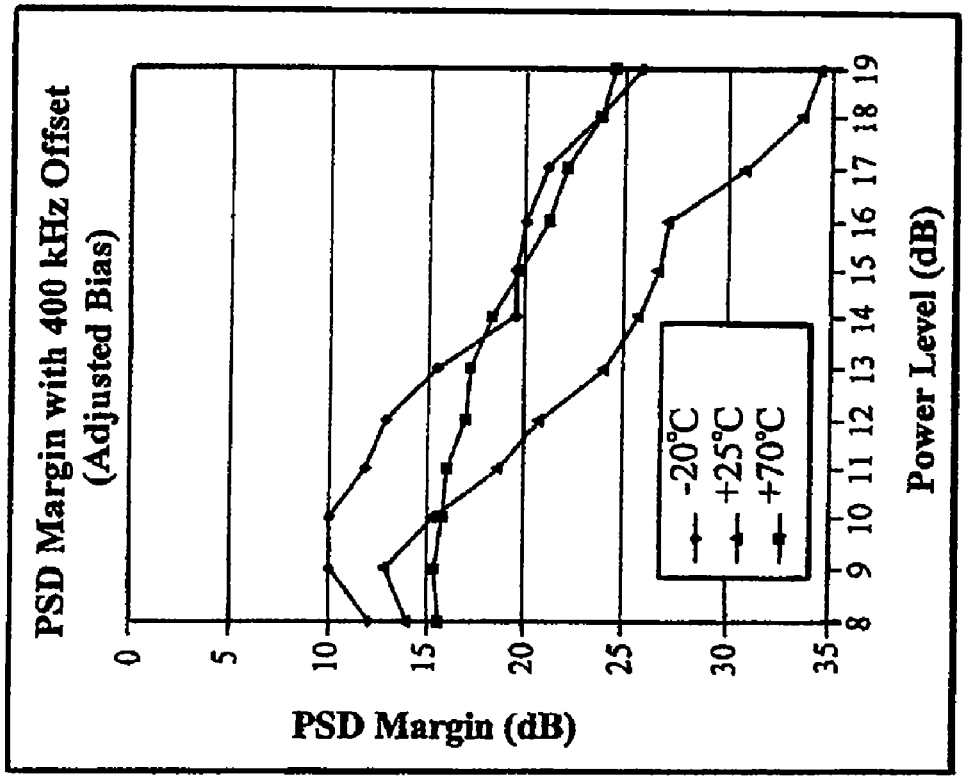
FIG. 12B illustrates the PSD margin with a 400 KHz offset over power amplifier power level at various temperatures, with an adjusted bias.
Figure 12A:
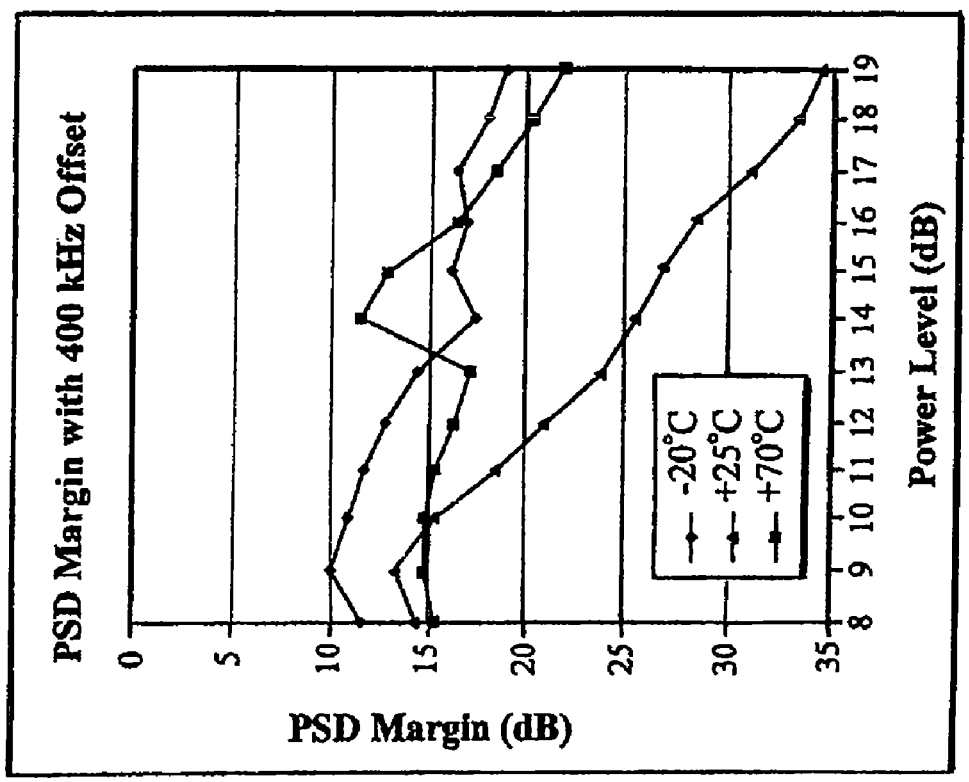
FIG. 12A illustrates the power spectral density (PSD) margin with a 400 KHz offset over power amplifier power level at various temperatures.
Figure 13B:
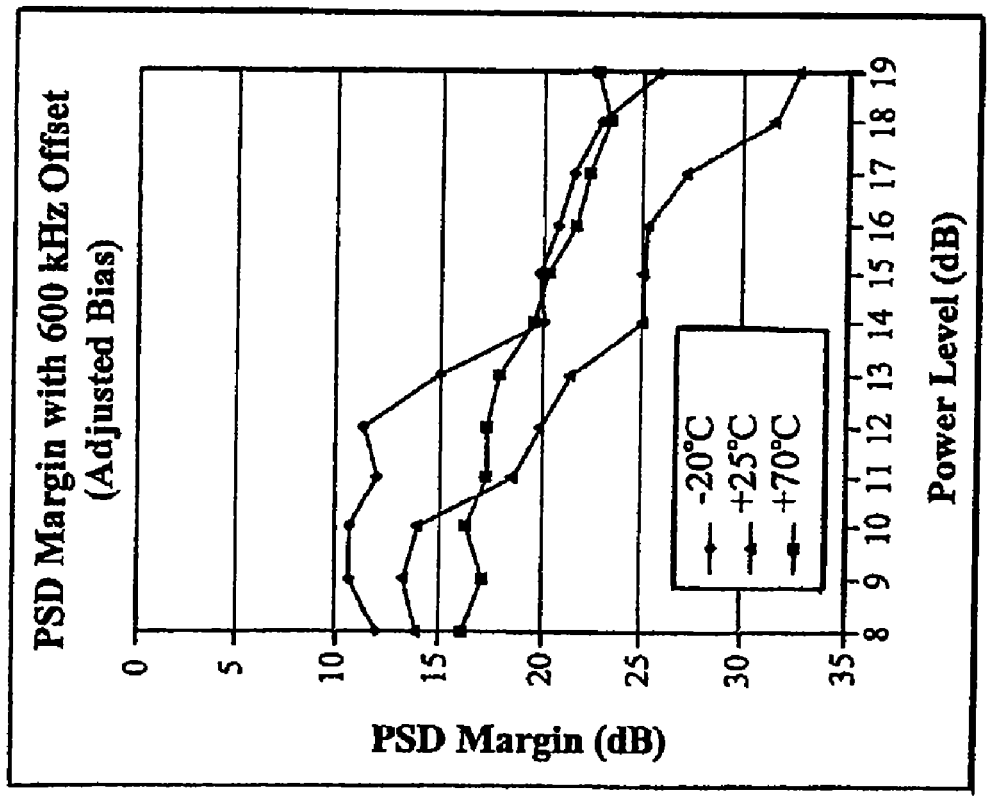
FIG. 13B illustrates the PSD margin with a 600 KHz offset over power amplifier power level at various temperatures, with an adjusted bias.
Figure 13A:
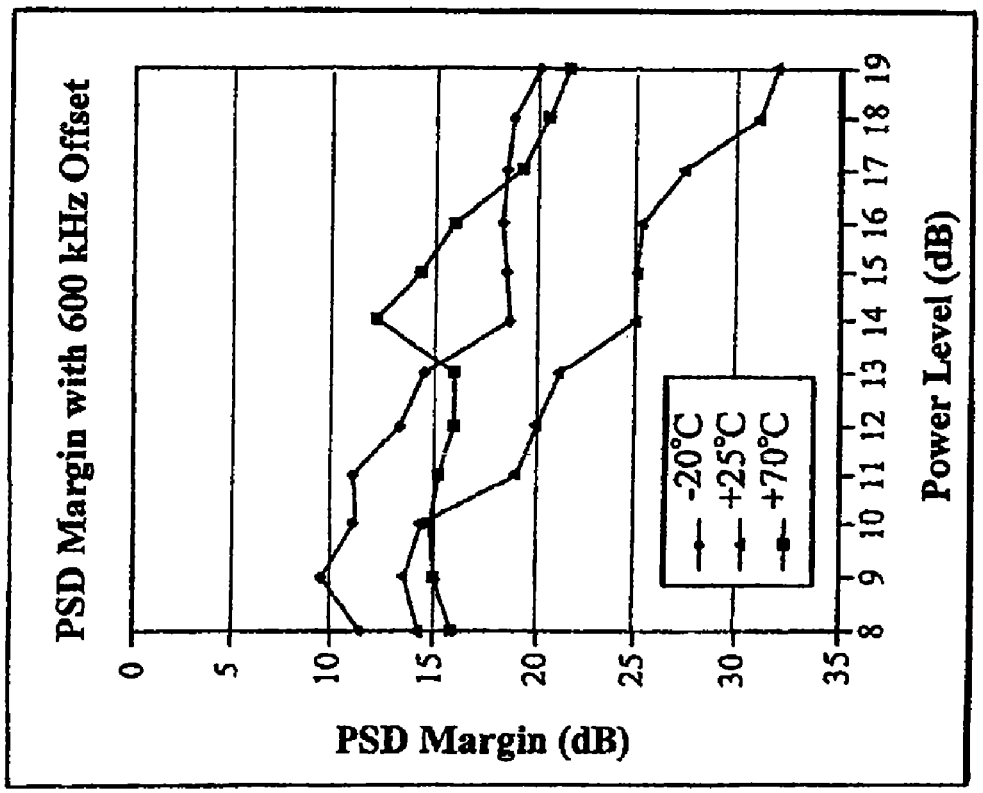
FIG. 13A illustrates the PSD margin with a 600 KHz offset over power amplifier power level at various temperatures.

FIGS. 12 and 13 show the power spectral density (PSD) margins at different temperatures for a variety of power levels. FIG. 12A illustrates PSD margin in decibels with a 400 KHz offset over −20, +25, and +70 degrees Celsius and power levels 8 through 19. FIG. 12B illustrates the PSD margin for the temperatures and power levels of FIG. 12A, but with an adjusted bias. FIG. 13A illustrates PSD margin in decibels for a variety of temperatures (−20, +25, and +70 degrees Celsius) and power levels (8 through 19), with a 600 KHz offset. FIG. 13B illustrates PSD margin in decibels for the temperatures and power levels of FIG. 13A, with a 600 KHz offset and an adjusted bias. As shown in these figures, the margins are robust in relation to performance of prior systems. Moreover, the bias adjustment of FIGS. 12B and 13B shows a minimal improvement effect over the uncompensated performances illustrated in FIGS. 12A and 13A.

Figure 14B:
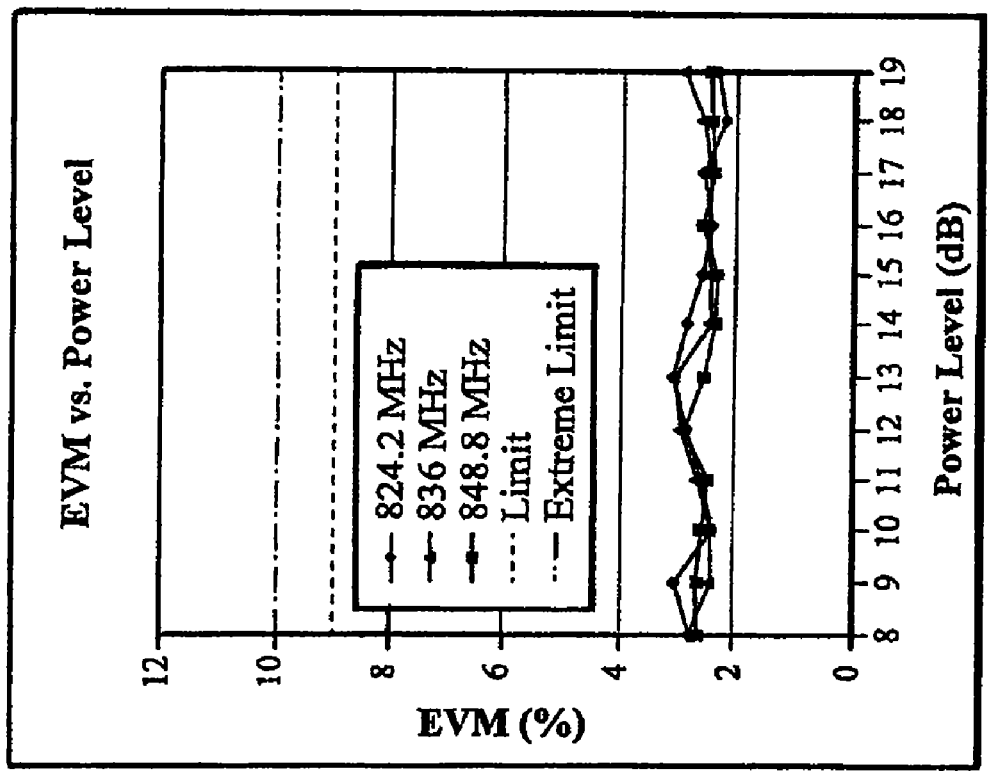
FIG. 14B illustrates EVM over power amplifier power level at various frequencies.
Figure 14A:
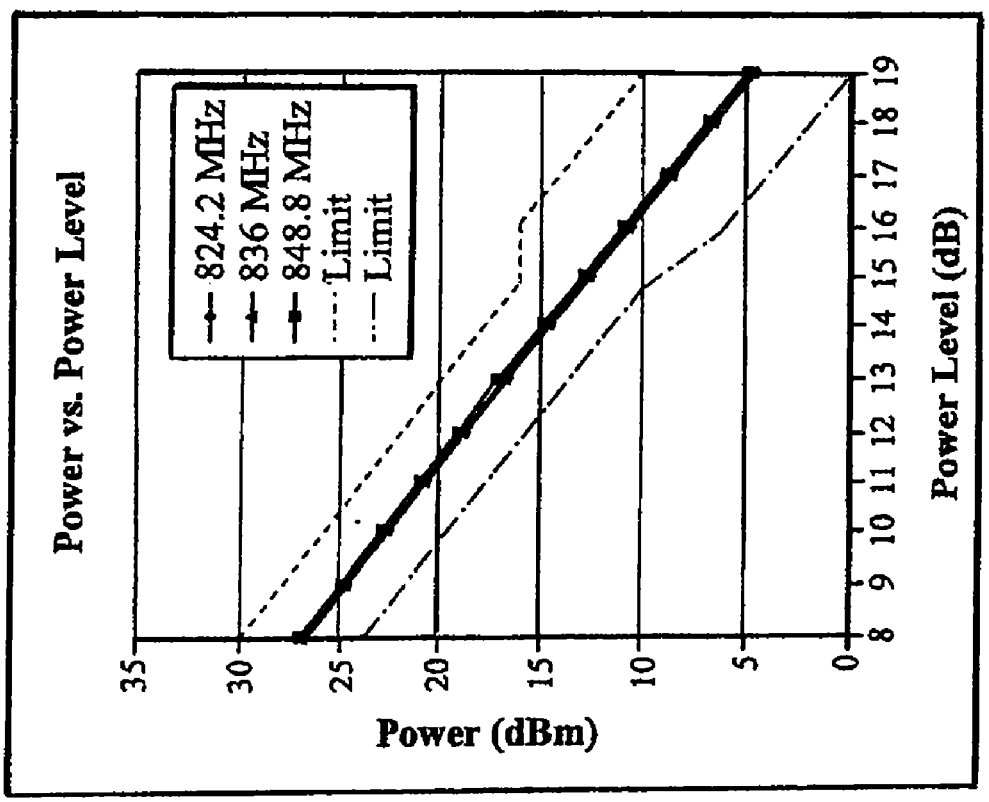
FIG. 14A illustrates power over power amplifier power level at various frequencies.
Figure 15B:
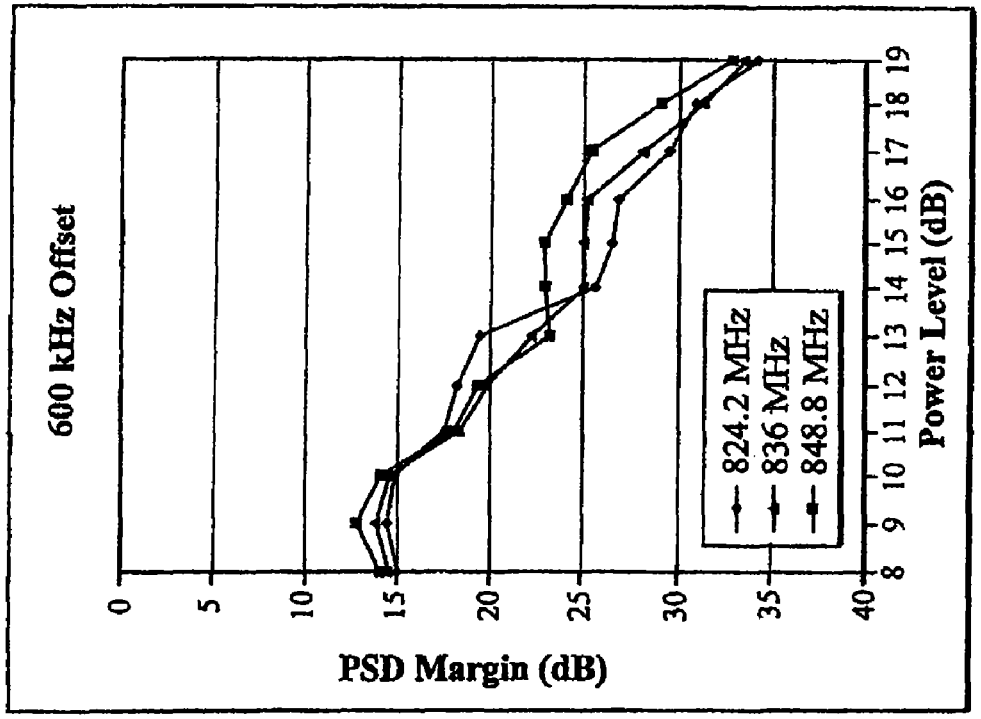
FIG. 15B illustrates the PSD margin with a 600 KHz offset over power amplifier power level at various frequencies.
Figure 15A:
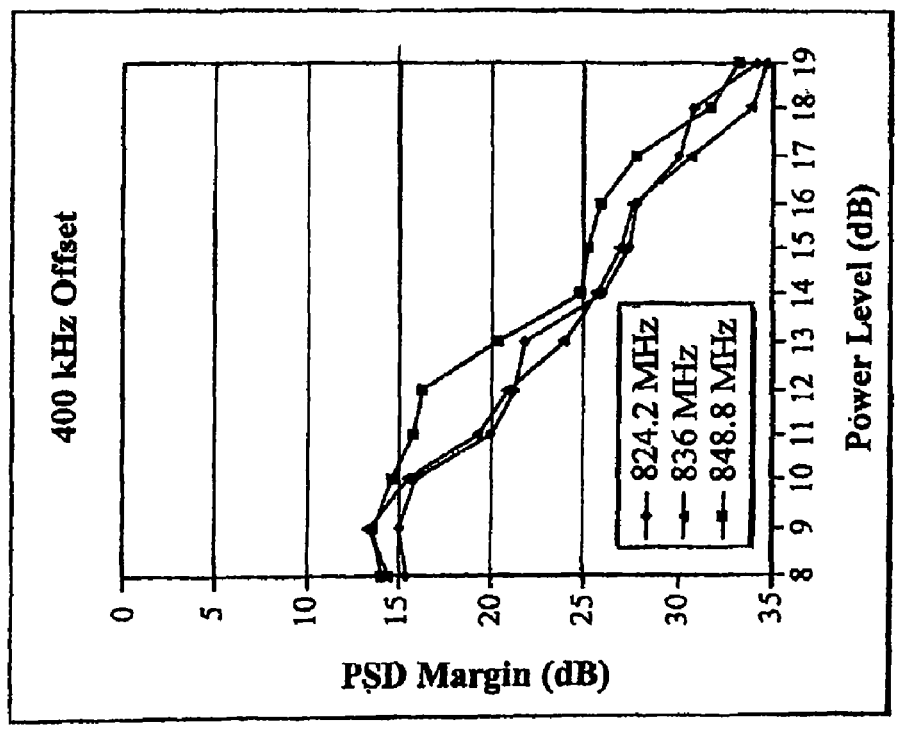
FIG. 15A illustrates the PSD margin with a 400 KHz offset over power amplifier power level at various frequencies.

FIGS. 14A-B and 15A-B show performance of the system 300 at maximum, mid-level and minimum frequency (848.8, 836, and 824.2 MHz), at room temperature. In particular, FIG. 14A illustrates power in decibel-milliwatts for these three frequencies and for power levels 8 through 19. FIG. 14B illustrates EVM (in percent (%)) for the three frequencies and power levels 8 through 19. FIG. 15A illustrates PSD margin in decibels for the three frequencies and power levels 8 through 19, with a 400 KHz offset. FIG. 15B illustrates PSD margin in decibels for the three frequencies and power levels 8 through 19, with a 600 KHz offset. As shown in these figures, the frequency has no significant effect on the performance of the system.

Figure 16:
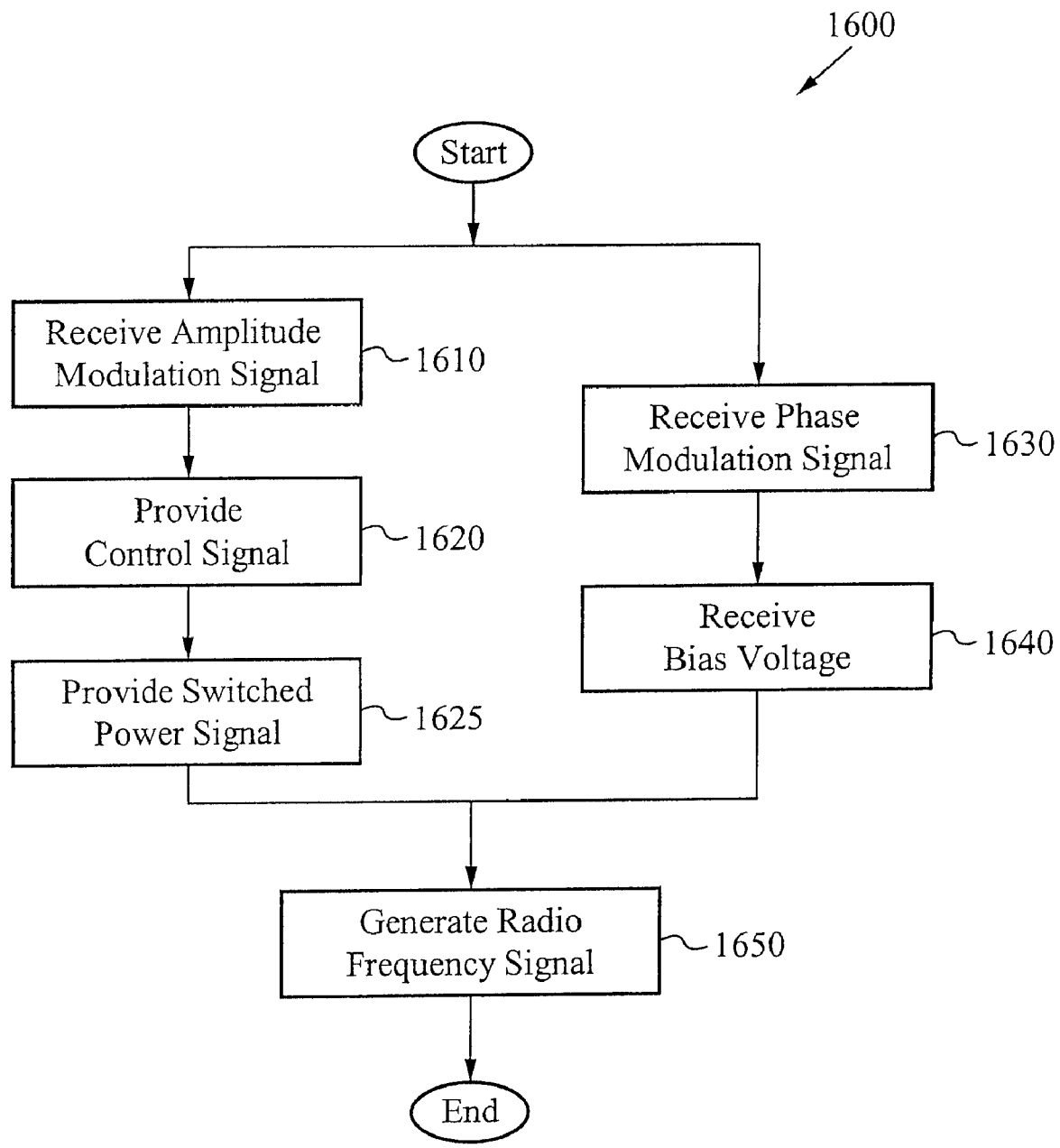
FIG. 16 illustrates a method in accordance with some embodiments of the invention.

FIG. 16 illustrates a process flow 1600 in accordance with some embodiments of the invention. As shown in this figure, the process 1600 begins at the step 1610, where an amplitude modulation signal is received. Then, the process 1600 transitions to the step 1620, where a control signal is provided based on the amplitude modulation signal that was received at the step 1625. Also, a switched power signal is provided at the step 1625 which is received at step 1610. At the step 1630, a phase modulation signal is received, and at the step 1640, a bias voltage is received. One of ordinary skill will recognize that phase modulation signal of the step 1630 and/or the bias voltage of the step 1640 are optionally received simultaneously with the amplitude modulation signal of the step 1610, or alternatively at another suitable time. However, the control signal of the step 1620 typically includes a particular timing.

Once the amplitude modulation signal, the phase modulation signal, and/or the bias voltage are received, and the control signal is provided, the process 1600 transitions to the step 1650, where a radio frequency signal is generated based on at least one of the phase modulation signal, the bias voltage, and the control signal. Preferably, generating the radio frequency signal comprises switching by using a high frequency device, such as a heterojunction bipolar junction transistor, as described above.

While the invention has been described with reference to numerous specific details, one of ordinary skill in the art will recognize that the invention can be embodied in other specific forms without departing from the spirit of the invention. For instance, the invention has primarily been described in relation to envelope modulators for polar transmitters. However, the foregoing is applicable to other circuits as well. Moreover, the power amplifier employing HBT technology of the embodiments described above showed robust performance, across a variety of conditions. One of ordinary skill will recognize additional implementations such as, for example, a population of power amplifier's employing the advantages of the embodiments described above. Further, additional embodiments are contemplated that include variations in parameters such as the value of the resistor R, for example. Thus, one of ordinary skill in the art will understand that the invention is not to be limited by the foregoing illustrative details, but rather is to be defined by the appended claims.

TABLE 1

| Power Level | $V_{BIAS}$ (V) | Resistor (ohm) | Power @ PA (dBm) | Current (A) | Max Driver Voltage (V) | Min Driver Voltage (V) | Max PA Voltage (V) | Min PA Voltage (V) |
|---|---|---|---|---|---|---|---|---|
| 8 | 2.2 | no | 28.23 | 0.934 | 2.51 | 0.49 | 2.51 | 0.49 |
| 9 | 2.2 | no | 26.27 | 0.770 | 2.012 | 0.430 | 2.012 | 0.430 |
| 10 | 2.2 | no | 24.23 | 0.638 | 1.618 | 0.371 | 1.618 | 0.371 |
| 11 | 2.2 | no | 22.20 | 0.532 | 1.312 | 0.319 | 1.312 | 0.319 |
| 12 | 2.2 | no | 20.15 | 0.446 | 1.064 | 0.281 | 1.064 | 0.281 |
| 13 | 2.2 | no | 18.13 | 0.382 | 0.896 | 0.241 | 0.896 | 0.241 |
| 14 | 1.98 | 5 | 16.21 | 0.252 | 2.508 | 0.542 | 0.911 | 0.258 |
| 15 | 1.98 | 5 | 14.22 | 0.209 | 2.056 | 0.468 | 0.777 | 0.230 |
| 16 | 1.98 | 5 | 12.25 | 0.176 | 1.691 | 0.405 | 0.665 | 0.206 |
| 17 | 1.98 | 5 | 10.24 | 0.149 | 1.400 | 0.347 | 0.583 | 0.182 |
| 18 | 1.98 | 5 | 8.35 | 0.128 | 1.166 | 0.303 | 0.501 | 0.164 |
| 19 | 1.98 | 5 | 6.24 | 0.111 | 0.978 | 0.258 | 0.431 | 0.148 |

What is claimed is:

1. A modulator comprising:
   a power driver operable to receive an amplitude modulation signal and generate a control signal based on the amplitude modulation signal;
   a switching device operable to prepare at least two power levels based on the control signal including a channel resistance, a switch component and an offset voltage;
   a supply voltage;
   a load resistance; coupled to switching device such that a current flows therethrough, the current involved in the generation of a radio frequency signal;
   wherein the current is approximated by the quantity of the supply voltage less the offset voltage, divided by the sum of the load resistance and the channel resistance; and
   a power amplifier operable to receive one of the at least two power levels,
   wherein the radio frequency signal is based on a phase modulation signal, a bias voltage, a switched power signal and the control signal, wherein the bias voltage is used to modify the phase modulation signal in response to the control signal.

2. The modulator of claim 1, the switching device comprising at least one heterojunction bipolar transistor (HBT).

3. The modulator of claim 1, the switching device configured for high speed operation.

4. The modulator of claim 1, further comprising a large amplitude input signal, wherein the supply voltage is greater than the offset voltage, and further wherein the load resistance is greater than the channel resistance, such that the current is approximated by the supply voltage divided by the load resistance.

5. The modulator of claim 1, further comprising a small amplitude input signal and a modulating resistance coupled in series with the load resistance, wherein the current is approximated by the supply voltage divided by the sum of the load resistance and the modulating resistance.

6. The modulator of claim 1, wherein a feedback signal is provided to the power driver.

7. The modulator of claim 1, further comprising a first transistor and a second transistor, wherein the first transistor is configured for operation when an input signal comprises a large amplitude signal, wherein the second transistor is configured for operation when the input signal comprises a small amplitude signal.

8. The modulator of claim 1, wherein the switching device is configured to provide the control signal to the power amplifier in a timely manner.

9. A modulator comprising:
   a power driver operable to receive an amplitude modulation signal and generate a control signal based on the amplitude modulation signal, wherein the power driver provides a saturation detection signal;
   a switching device operable to prepare at least two power levels based on the control signal; and
   a power amplifier operable to receive one of the at least two power levels.

10. The modulator of claim 9, the switching device comprising at least one heterojunction bipolar transistor (HBT).

11. The modulator of claim 9, the switching device configured for high speed operation.

12. The modulator of claim 9, the switching device comprising:
   a channel resistance;
   a switch component; and
   an offset voltage.

13. The modulator of claim 12, further comprising a supply voltage and a load resistance coupled to the switching device such that a current flows therethrough, the current involved in the generation of a radio frequency signal.

14. The modulator of claim 13, wherein the current is approximated by the quantity of the supply voltage less the offset voltage, divided by the sum of the load resistance and the channel resistance.

15. The modulator of claim 14, further comprising a large amplitude input signal, wherein the supply voltage is greater than the offset voltage, and further wherein the load resistance is greater than the channel resistance, such that the current is approximated by the supply voltage divided by the load resistance.

16. The modulator of claim 14, further comprising a small amplitude input signal and a modulating resistance coupled in series with the load resistance, wherein the current is approximated by the supply voltage divided by the sum of the load resistance and the modulating resistance.

17. The modulator of claim 14, wherein the radio frequency signal is based on a phase modulation signal, a bias voltage, a switched power signal and the control signal, wherein the bias voltage is used to modify the phase modulation signal in response to the control signal.

18. The modulator of claim 9, wherein a feedback signal is provided to the power driver.

19. The modulator of claim 9, further comprising a first transistor and a second transistor, wherein the first transistor is configured for operation when an input signal comprises a large amplitude signal, wherein the second transistor is configured for operation when the input signal comprises a small amplitude signal.

20. The modulator of claim 9, wherein the switching device is configured to provide the control signal to the power amplifier in a timely manner.

\* \* \* \* \*